(12) United States Patent
Harish et al.

(10) Patent No.: US 10,670,623 B2
(45) Date of Patent: Jun. 2, 2020

(54) ACCELEROMETERS

(71) Applicant: Atlantic Inertial Systems Limited, Plymouth, Devon (GB)

(72) Inventors: Kiran Mysore Harish, Plymouth (GB); Alan Malvern, Plymouth (GB)

(73) Assignee: Atlantic Inertial Systems Limited, Devon (GB)

( * ) Notice: Subject to any disclaimer, the term of this patent is extended or adjusted under 35 U.S.C. 154(b) by 86 days.

(21) Appl. No.: 15/754,293

(22) PCT Filed: Aug. 11, 2016

(86) PCT No.: PCT/GB2016/052501
§ 371 (c)(1),
(2) Date: Feb. 21, 2018

(87) PCT Pub. No.: WO2017/025753
PCT Pub. Date: Feb. 16, 2017

(65) Prior Publication Data
US 2018/0217179 A1 Aug. 2, 2018

(30) Foreign Application Priority Data
Aug. 12, 2015 (GB) .................................. 1514319.1

(51) Int. Cl.
*G01P 15/125* (2006.01)
*B81B 3/00* (2006.01)
*G01P 15/08* (2006.01)

(52) U.S. Cl.
CPC .......... *G01P 15/125* (2013.01); *B81B 3/0051* (2013.01); *B81B 3/0059* (2013.01);
(Continued)

(58) Field of Classification Search
CPC .......... G01P 15/125; G01P 2015/0814; G01P 2015/0082
(Continued)

(56) References Cited

U.S. PATENT DOCUMENTS

| 7,797,889 B2 | 9/2010 | Mendard et al. |
| 8,250,920 B2 | 8/2012 | Yamanaka et al. |

(Continued)

FOREIGN PATENT DOCUMENTS

| CA | 2915176 A1 | 11/2014 |
| EP | 2081030 A2 | 7/2009 |

(Continued)

OTHER PUBLICATIONS

Korean Notification of Preliminary Rejection for Korean Patent Application No. 10-2018-7006830, dated May 29, 2019, 12 pages.

(Continued)

*Primary Examiner* — John Fitzgerald
*Assistant Examiner* — Rodney T Frank
(74) *Attorney, Agent, or Firm* — Kinney & Lange, P.A.

(57) ABSTRACT

A capacitive accelerometer comprises: a substantially planar proof mass mounted to a fixed substrate by flexible support legs so as to be linearly moveable in an in-plane sensing direction. The proof mass comprises first and second sets of moveable capacitive electrode fingers. First and second sets of fixed capacitive electrode fingers interdigitates with the first and second sets of moveable electrode fingers respectively. A set of moveable damping fingers extend from the proof mass substantially perpendicular to the sensing direction, laterally spaced in the sensing direction. A set of fixed damping fingers mounted to the fixed substrate interdigitates with the set of moveable damping fingers and comprises an electrical connection to the proof mass so that the interdigitated damping fingers are electrically common. The damp- (Continued)

ing fingers are mounted in a gaseous medium that provides a damping effect.

15 Claims, 5 Drawing Sheets

(52) U.S. Cl.
CPC ............... *B81B 2201/0235* (2013.01); *G01P 2015/0814* (2013.01); *G01P 2015/0882* (2013.01)

(58) Field of Classification Search
USPC ...................................................... 73/514.14
See application file for complete search history.

(56) References Cited

U.S. PATENT DOCUMENTS

| | | | |
|---|---|---|---|
| 9,964,562 B2 | 5/2018 | Ogawa | |
| 2005/0081632 A1* | 4/2005 | Malvern | G01P 15/0802 |
| | | | 73/514.12 |
| 2006/0112765 A1* | 6/2006 | Malvern | G01P 1/006 |
| | | | 73/514.32 |
| 2006/0137450 A1* | 6/2006 | Eskridge | G01P 15/0802 |
| | | | 73/514.16 |
| 2008/0196500 A1 | 8/2008 | Menard et al. | |
| 2011/0016972 A1 | 1/2011 | Reinert | |
| 2013/0247667 A1* | 9/2013 | Malvern | G01P 15/125 |
| | | | 73/514.32 |
| 2014/0090468 A1 | 4/2014 | Fu | |
| 2015/0143906 A1 | 5/2015 | Ogawa | |
| 2016/0252544 A1* | 9/2016 | Malvern | G01P 15/125 |
| | | | 73/514.32 |
| 2016/0334439 A1* | 11/2016 | Malvern | B81B 5/00 |
| 2016/0356806 A1* | 12/2016 | Malvern | G01P 15/125 |
| 2017/0089947 A1* | 3/2017 | Townsend | G01P 15/125 |

FOREIGN PATENT DOCUMENTS

| | | |
|---|---|---|
| JP | H11118827 A | 4/1999 |
| JP | 20075019838 A | 2/2007 |
| JP | 2009168777 A | 7/2009 |
| JP | 2010085313 A | 4/2010 |
| JP | 2014016341 A | 1/2014 |
| KR | 20080052183 A | 6/2008 |
| KR | 100881486 B1 | 2/2009 |
| WO | 2015052487 A1 | 4/2015 |

OTHER PUBLICATIONS

International Search Report & Written Opinion, for PCT Patent Application No. PCT/GB2016/052501, dated Oct. 11, 2016, 13 pages.

* cited by examiner

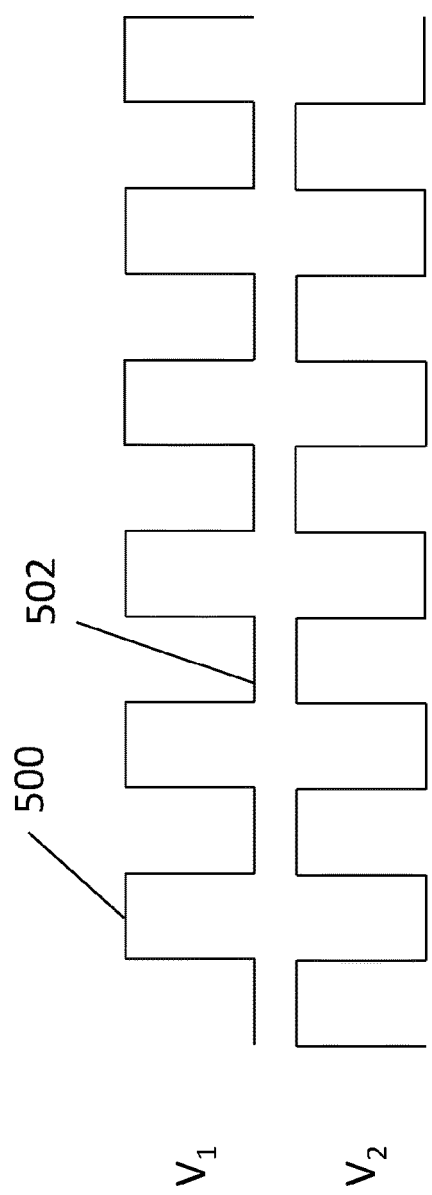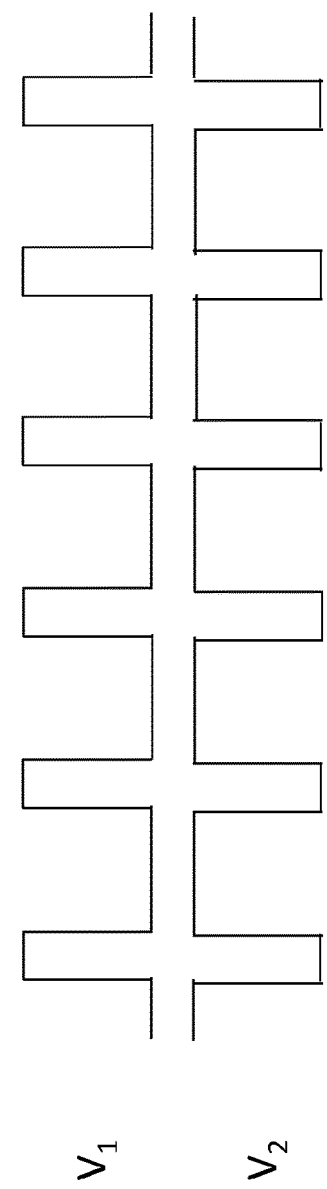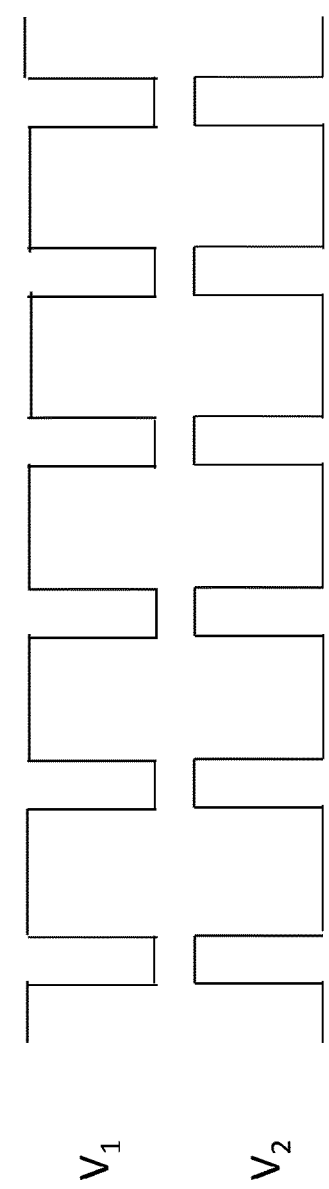

ACCELEROMETERS

CROSS-REFERENCE TO RELATED APPLICATION(S)

This application is the national phase of PCT Application No. PCT/GB2016/052501 filed on Aug. 11, 2016, which in turn claims priority to British Application No. 1514319.1 filed on Aug. 12, 2015, both of which are incorporated by reference herein.

TECHNICAL FIELD

The present disclosure relates to accelerometers, and in particular to capacitive accelerometers.

BACKGROUND

Accelerometers are found in many modern electronic devices, and are used in order to determine acceleration. Microelectromechanical Systems (MEMS)-based accelerometers have become ubiquitous in recent years, and are often far more effective than their conventional macroscopic counterparts.

It is known in the art per se to use interdigitated capacitive electrode "fingers" to sense acceleration. An example of such a capacitive accelerometer is described in U.S. Pat. No. 7,047,808. When the accelerometer undergoes acceleration, a moveable set of capacitive electrode fingers attached to a proof mass tends to move from a null position relative to a fixed set of capacitive electrode fingers attached to an inertial frame.

Capacitive accelerometers can be operated either in what is known as "open loop" or "closed loop". In an open loop system, the capacitive accelerometer is arranged to sense the change in capacitance between the electrode fingers caused by the relative movement of the proof mass e.g. a so-called "pick off" voltage is used to determine acceleration. In a closed loop system, the electrode fingers are used for both driving and sensing. Typically, in-phase and anti-phase pulse width modulation (PWM) voltage waveforms are applied to the fixed electrode fingers and the PWM mark/space ratio is adjusted to drive the proof mass back to its null position (i.e. the position it would be in were it not undergoing acceleration). The mark/space ratio provides a linear measure of acceleration.

Capacitive accelerometers, especially those operated in closed loop, require a very low vibration rectification error (VRE). As the response of a capacitive accelerometer is non-linear with respect to motion, due to the non-linear dependence of electrostatic force with proof mass position (the electrostatic force is inversely proportional to the square of the gap between electrodes), vibration causes the accelerometer to have a DC acceleration output even though it is not accelerating, resulting in a significant VRE. Reducing VRE can be achieved by reducing the residual proof mass motion. In closed loop, the residual motion can be reduced by having a high gain around the loop which normally requires a high bandwidth. However, the maximum gain that can be applied is limited, and the bandwidth is also limited by virtue of computational delays and the resonance frequency of the MEMS, so some degree of residual motion is inevitable. Any delay in the loop limits the bandwidth and thus the maximum open loop gain.

Furthermore, in the case of both open and closed loop systems, it is also important to ensure that the moveable set of electrode fingers does not move too much if a capacitive accelerometer undergoes large "shock" accelerations. If the moveable set of fingers moves too far, it will "touch down" i.e. it will make physical contact with the fixed set of fingers. While there are bump stops put in place in order to prevent this happening, at high levels of acceleration it can still occur due to finger flexure and this limits the operational range of the accelerometer. Shocks may cause damage to the accelerometer, particularly as the interdigitated sets of electrode fingers will be at different electrical potentials; For example, the Gemini range of MEMS accelerometers available from Silicon Sensing provides a dynamic range up to ±96 g with an operating shock of 1000 g.

As there are relatively small spaces between the electrode fingers, an effect known as squeeze film damping takes place, wherein a gaseous medium between the electrode fingers damps the motion of the fingers due to the viscosity of the gaseous medium. The residual motion of the proof mass is therefore damped to a degree by this squeeze film damping effect. However, there are inherent limits to the geometry of the interdigitated electrode fingers, particularly for closed loop accelerometers wherein the fingers have to be stiff enough in order to prevent them deforming under an applied voltage (e.g. 35 V) and this requires a minimum thickness. Typically, the capacitive electrode fingers are trapezoidal with a typical width of 20 microns at the root, tapered to a width of around 12 microns at the tip. Also there needs to be a sufficient gap either side of each finger, wherein there is an offset between successive adjacent capacitive electrode finger pairings, such that there is a larger gap on one side of any given electrode finger than on the other side. Typical spacing between the interdigitated capacitive electrode fingers may be around 6 microns for the smaller gap and 16 microns for the larger gap. The resulting pitch of the sets of interdigitated capacitive electrode fingers (i.e. the spacing between pairs of fingers within the set) is typically around 50 microns, which limits the effectiveness of the squeeze film damping in counteracting residual motion.

It would be desirable to reduce the residual motion of the proof mass in a capacitive accelerometer to provide various benefits. The present disclosure seeks to reduce or overcome the disadvantages outlined above.

SUMMARY

The present disclosure, when viewed from a first aspect, provides a capacitive accelerometer comprising:

a substantially planar proof mass mounted to a fixed substrate by flexible support legs so as to be linearly moveable in an in-plane sensing direction in response to an applied acceleration;

the proof mass comprising first and second sets of moveable capacitive electrode fingers extending from the proof mass substantially perpendicular to the sensing direction and laterally spaced in the sensing direction;

first and second fixed capacitor electrodes mounted to the fixed substrate, the first fixed capacitor electrode comprising a first set of fixed capacitive electrode fingers and the second fixed capacitor electrode comprising a second set of fixed capacitive electrode fingers, wherein the first and second sets of fixed capacitive electrode fingers extend substantially perpendicular to the sensing direction and are laterally spaced in the sensing direction;

the first set of fixed capacitive electrode fingers arranged to interdigitate with the first set of moveable capacitive electrode fingers of the proof mass and the second set of fixed capacitive electrode fingers arranged to interdigitate with the second set of moveable capacitive electrode fingers of the proof mass, the first and second sets of moveable capacitive electrode fingers further comprising electrical pick-off connections arranged to provide an output voltage, in use, for sensing an applied acceleration;

wherein the first set of moveable capacitive electrode fingers is provided with a first non-zero offset in a first direction from a first median line between adjacent ones of the first set of fixed capacitive electrode fingers; and the second set of moveable capacitive electrode fingers is provided with a second non-zero offset in a second, opposite direction from a second median line between adjacent ones of the second set of fixed capacitive electrode fingers, wherein the first and second offsets are substantially symmetrical across a median line between the first and second fixed capacitor electrodes;

the proof mass further comprising a set of moveable damping fingers extending from the proof mass substantially perpendicular to the sensing direction and laterally spaced in the sensing direction; and a set of fixed damping fingers mounted to the fixed substrate and arranged to interdigitate with the set of moveable damping fingers, the fixed damping fingers extending substantially perpendicular to the sensing direction and laterally spaced in the sensing direction;

wherein the set of fixed damping fingers comprises an electrical connection to the proof mass so that the interdigitated fixed and moveable damping fingers are electrically common; and wherein the interdigitated moveable and fixed damping fingers are mounted in a gaseous medium that provides a damping effect counteracting relative displacement between the moveable and fixed damping fingers when the proof mass tends to move in response to an applied acceleration.

Thus it will be appreciated by those skilled in the art that the present disclosure provides an accelerometer that has dedicated sets of interdigitated damping fingers that provide gaseous medium squeeze film damping separate to the interdigitated capacitive electrode fingers that are used for sensing acceleration.

In some examples the first and second sets of fixed capacitive electrode fingers further comprise electrical connections arranged to provide an input voltage in response to an applied acceleration. In such examples, the accelerometer can operated in closed loop, wherein a voltage may be applied to drive the proof mass to a null position. It will be appreciated that these electrical connections may be achieved by connecting directly to the conductive MEMS layer in which the interdigitated moveable and fixed damping fingers are fabricated. These electrical connections on the first and second sets of fixed capacitive electrode fingers can also be used for open loop operation as described in greater detail below.

The improved damping characteristic of the disclosed accelerometer reduces the residual motion of the proof mass, which in turn reduces the VRE of the accelerometer. This helps to eliminate unwanted bias voltages from appearing at the output of the accelerometer when it is under vibration. Reducing residual motion also allows a higher vibration amplitude to be applied before bump stops prevent the electrode fingers from touching down. A reduction in residual motion thereby increases the operational vibration range. Furthermore, reducing residual motion helps to reduce the bias variation as the accelerometer behaves more like a perfect non-moving system without variations resulting from time and temperature.

It will also be appreciated by those skilled in the art that an accelerometer according to the present disclosure is beneficial in both open and closed loop implementations wherein it is desirable to prevent touch down, since recovery (i.e. returning the proof mass to its null position) from a touch down event takes time during which the accelerometer is not operational. However, as mentioned above, the damping of residual motion is particularly limited in accelerometers designed to operate in closed loop as the electrode fingers are used to apply an electrostatic force to the null the motion of the proof mass as well as providing an output "pick off" voltage to sense displacement of the proof mass from the null position, so the fingers need to be stiff to prevent flexure.

As the additional damping fingers provided according to the present disclosure are not driven in closed loop operation, there is no risk of deformation under an applied voltage and thus the damping fingers can be of a smaller size than the capacitive electrode fingers, providing a smaller pitch. Since the damping factor is inversely proportional to the cube of the pitch, an increased squeeze film damping effect is readily achieved. Of course, the interdigitated capacitive electrode fingers in conventional accelerometers contribute a lesser amount of inherent squeeze film damping than these smaller damping fingers because they have to be made stiff enough to withstand a typical HT voltage of 35 V and to ensure a flexure below 0.5 microns. The damping fingers, on the other hand, are electrically common so there are no electrostatic forces between them.

The damping fingers can be fabricated to be narrower (i.e. have a smaller width in the sensing direction) than the capacitive electrode fingers. Accordingly, in some sets of examples each of the interdigitated damping fingers is narrower than the interdigitated capacitive electrode fingers. While the depth of the fingers is usually set by the particular MEMS fabrication process (typically around 100 microns), the width of the channels etched during fabrication can be controlled to produce fingers of a desired width. In some examples, the width at the root of each damping finger is 15 microns or less, preferably 10 microns or less, further preferably 8 microns or less. This allows for the dedicated interdigitated damping finger sets to be fabricated with a greater density than the interdigitated capacitive electrode finger sets.

As outlined above, the moveable capacitive electrode fingers which provide the accelerometer with its sensing capabilities are spaced laterally with first and second offsets (i.e. the gap on one side of any given finger is wider than the gap on the other side). Typically the respective small and large gap sizes might be 6 microns and 16 microns respectively. However, the damping fingers do not need any such offset and thus in some examples the interdigitated damping fingers are equally spaced in the sensing direction. In some examples, the gap between adjacent damping fingers is less than 16 microns, preferably 10 microns or less, further preferably 6 microns or less. This also means that, at least in preferred examples, the interdigitated sets of damping fingers are laterally spaced with a greater density than the interdigitated sets of capacitive electrode fingers, significantly increasing the damping factor of the accelerometer.

As the damping fingers can be spaced closer together and made thinner, the resulting pitch of the damping fingers can also be smaller than that of the capacitive electrode fingers, which is typically of the order of 50 microns. In some examples, the pitch of the damping fingers is less than 50 microns, preferably less than 40 microns, further preferably less than 25 microns, for example 20 microns or less. An exemplary accelerometer in accordance with the present disclosure might have as many as two and a half times the number of damping fingers as capacitive electrode fingers, and the resulting damping factor may be around 3 to 10, while the damping factor associated with conventional accelerometers may typically be around 0.5.

It will be appreciated by those skilled in the art that while for optimal squeeze film damping it is desirable for the fixed and moveable damping fingers to extend perpendicular to (i.e. be at 90 degrees to) the sensing direction, sub-optimal damping may still be achieved by having the fixed and/or moveable damping fingers extend at an oblique angle to the sensing direction. Thus the term "substantially perpendicular" will be understood to include arrangements wherein the fixed and/or moveable damping fingers extend in a direction having a component perpendicular to the sensing direction i.e. the fixed and/or moveable damping fingers extend in a direction that forms an angle greater than 0 degrees and less than or equal to 90 degrees with the sensing direction.

While there may be a number of suitable configurations of the interdigitated fixed and moveable damping finger sets, in preferred examples the accelerometer comprises a plurality of interdigitated damping finger sets arranged substantially symmetrically. By maintaining a high degree of symmetry across the accelerometer, and locating the centre of mass of the proof mass centrally with regard to the support (i.e. the support legs), the risk of the structure moving in a direction perpendicular to the sensing direction is reduced, thus preventing the device from twisting undesirably. For example, the accelerometer may comprise a first set of interdigitated moveable and fixed damping fingers mounted on one side of the proof mass and a second set of interdigitated moveable and fixed damping fingers mounted on another side of the proof mass. The first and second sets of interdigitated damping fingers may be mounted so as to ensure symmetry in the sensing direction and/or laterally of the sensing direction.

In some examples the proof mass may take the form of a frame that encloses the moveable and fixed capacitive electrode fingers. The one or more moveable sets of damping fingers may extend inside the frame of the proof mass. However, alternatively (or additionally) the one or more moveable sets of damping fingers may extend outside the frame of the proof mass. Accordingly the interdigitated set of damping fingers may be positioned outside the frame. Those skilled in the art will appreciate that, as the damping fingers do not form part of the sensing arrangement, they may be located wherever is convenient e.g. for a specific MEMS implementation.

It will be appreciated by those skilled in the art that the fixed and moveable damping finger sets being electrically common means that the damping fingers are each held at substantially the same electrical potential (i.e. voltage) and thus cannot provide any sensing or driving functionality. This is ensured by the electrical connection between the fixed damping fingers and the proof mass that effectively provides a short circuit so that no electrostatic forces can build up between the damping fingers. This is in contrast to the fixed and moveable capacitive electrode fingers which necessarily have a potential difference therebetween for sensing and/or driving purposes. In examples of this disclosure, the electrical connection to the proof mass may comprise one or more metal tracks running from the fixed damping fingers. As the fixed damping fingers are mounted to the fixed substrate (e.g. glass), the metal tracks may be connected to the proof mass (e.g. silicon) by downhole vias extending between the fixed substrate layer and the proof mass layer (e.g. in a silicon-on-glass MEMS construction).

The Applicant has appreciated that by having dedicated interdigitated "damping" fingers specifically for providing squeeze film damping, the fixed and moveable damping fingers being electrically common, ensures that there is no electrostatic force between the fixed and moveable damping fingers, increasing the effectiveness of the damping and reducing the chance of damage.

In typical implementations, the interdigitated capacitive electrode fingers are mounted in the same gaseous medium as the interdigitated damping fingers. For example, the accelerometer may take the form of a sealed unit wherein the capacitive electrode fingers and the damping fingers are mounted in the same gaseous medium. The accelerometer may comprise any suitable gaseous medium to provide a squeeze film damping effect. The gaseous medium may comprise one or more of air, nitrogen, argon, helium or neon. The gaseous medium may be contained at atmospheric pressure or at an elevated pressure. For example, the gaseous medium may be contained at a pressure up to about 10 bar. While the damping factor is only weakly dependent on the pressure of the gaseous medium, gases with a higher viscosity such as neon and argon provide an improved damping effect when compared to lower viscosity gases such as air, and are thus preferable for achieving optimal damping characteristics.

While there are a number of possible shapes and configurations that the capacitive electrode fingers and/or damping fingers could take, in some examples the capacitive electrode fingers and/or damping fingers are trapezoidal. By providing the fingers with a trapezoidal shape wherein the "root" of the finger (i.e. the end of the finger affixed to a surface) is wider than the "tip" (i.e. the other end of the finger), the fingers have a greater stiffness while not requiring any more physical space.

There are also a number of device geometries to which the present disclosure could be readily applied, particularly with regard to the configuration of the moveable proof mass. In a set of examples the proof mass comprises a moveable frame on compliant legs, for example a rectangular frame. Such a frame can then, at least in some examples, be mounted to the fixed substrate by an anchor arrangement. The moveable capacitive electrode fingers may be arranged symmetrically inside the frame of the proof mass.

Depending on the particular implementation, the fixed substrate may take different shapes and structures. However, in some examples, the fixed substrate is substantially planar. The fixed substrate may be rectangular e.g. to match the shape of the proof mass. The fixed substrate may also be made from any suitable material but is preferably made of an insulator such as glass. The one or more sets of fixed damping fingers may then be anodically bonded to the glass substrate in the same process as the proof mass support legs and fixed capacitive electrode fingers. The interdigitated damping fingers are fabricated from the same MEMS layer as the proof mass and fixed capacitive electrode fingers, but are electrically isolated by virtue of the deep trenches resulting from the etching process carried out during fabrication.

In any examples of this disclosure, the proof mass and the fixed electrode fingers may be integrally formed from a semiconductor substrate, for example a silicon substrate. The capacitive accelerometer may take the form of a MEMS accelerometer.

It will be appreciated by those skilled in the art that the present disclosure extends to a method of operating a capacitive accelerometer comprising:

a substantially planar proof mass mounted to a fixed substrate by flexible support legs so as to be linearly moveable in an in-plane sensing direction in response to an applied acceleration;

the proof mass comprising first and second sets of moveable capacitive electrode fingers extending from the proof mass substantially perpendicular to the sensing direction and laterally spaced in the sensing direction;

first and second fixed capacitor electrodes mounted to the fixed substrate, the first fixed capacitor electrode comprising a first set of fixed capacitive electrode fingers and the second fixed capacitor electrode comprising a second set of fixed capacitive electrode fingers, wherein the first and second sets of fixed capacitive electrode fingers extend substantially perpendicular to the sensing direction and are laterally spaced in the sensing direction;

the first set of fixed capacitive electrode fingers arranged to interdigitate with the first set of moveable capacitive electrode fingers of the proof mass and the second set of fixed capacitive electrode fingers arranged to interdigitate with the second set of moveable capacitive electrode fingers of the proof mass, the first and second sets of moveable capacitive electrode fingers further comprising electrical pick-off connections arranged to provide an output voltage, in use, for sensing an applied acceleration;

wherein the first set of moveable capacitive electrode fingers is provided with a first non-zero offset in a first direction from a first median line between adjacent ones of the first set of fixed capacitive electrode fingers; and the second set of moveable capacitive electrode fingers is provided with a second non-zero offset in a second, opposite direction from a second median line between adjacent ones of the second set of fixed capacitive electrode fingers, wherein the first and second offsets are substantially symmetrical across a median line between the first and second fixed capacitor electrodes;

the proof mass further comprising a set of moveable damping fingers extending from the proof mass substantially perpendicular to the sensing direction and laterally spaced in the sensing direction; and a set of fixed damping fingers arranged to interdigitate with the set of moveable damping fingers, the fixed damping fingers extending substantially perpendicular to the sensing direction and laterally spaced in the sensing direction; wherein the set of fixed damping fingers comprises an electrical connection to the proof mass so that the interdigitated fixed and moveable damping fingers are electrically common; and wherein the interdigitated moveable and fixed damping fingers are mounted in a gaseous medium that provides a damping effect counteracting relative displacement between the moveable and fixed damping fingers when the proof mass tends to move in response to an applied acceleration;

the method comprising:

obtaining the output voltage from the electrical pick-off connections and processing the output voltage to determine therefrom the applied acceleration.

The disclosed method is suitable for operating the accelerometer in open loop or closed loop. In both cases, the additional squeeze film damping provided by the dedicated damping fingers will reduce the residual motion of the proof mass (in closed loop operation), reduce vibration-induced motion (in open loop operation), and provide the benefits discussed above. In open loop operation, processing the output voltage may comprise measuring the amplitude of the output voltage to determine the applied acceleration. In various examples the method may comprise driving the fixed capacitive electrode fingers by applying in-phase and anti-phase drive signals. In open loop operation, in-phase and anti-phase square waves are applied to the two fixed electrodes and, due to the opposing offsets, the differential capacitance varies with applied acceleration and the resulting pickoff signal (from the proof mass) can be demodulated (since the drive frequency is known) and low pass filtered to give an output signal that is proportional to the proof mass motion (i.e. the applied acceleration).

However, a particular improvement may be achieved for accelerometers operating in closed loop as the inherent damping provided by the capacitive electrode fingers is then limited by the required stiffness and hence thickness of the fingers. In closed loop operation, the drive signals may comprise pulse width modulation (PWM) signals, and processing the output voltage may comprise using the output voltage obtained from the electrical connections to vary a mark/space ratio of the PWM drive signals, e.g. so that under an applied acceleration the mechanical inertial forces of the proof mass are balanced by electrostatic forces to maintain the proof mass at a null position (i.e. the PWM sense signal from the proof mass acts as an error signal) and the mark/space ratio of the applied PWM drive signal provides an output having a linear relationship with the applied acceleration. Similarly to open loop operation, the pickoff signal can be demodulated and used to set the mark/space ratio of the drive signal. The PWM drive signals are usually pulse wave signals (i.e. rectangular waves with a variable mark/space ratio) and applied to the fixed electrodes. WO 2005/084351, hereby incorporated by reference, provides an example of a closed loop electronic control circuit that utilises such PWM drive signals. The control circuit is arranged to drive first and second sets of fixed electrode fingers with in-phase and anti-phase PWM signals respectively, such that the proof mass remains in its null position by due to the electrostatic forces cancelling the inertial force arising from the applied acceleration. The mark/space ratio of the PWM drive signals can be adjusted to produce a variable rebalance force. Sinusoidal waves are not typically used as they cause the electrostatic force to vary throughout the cycle and a constant voltage is required to ensure linearity of electrostatic force with mark/space ratio.

Thus in examples of an accelerometer as disclosed above, the first and second sets of fixed capacitive electrode fingers may further comprise electrical connections arranged to provide a drive voltage. As stated previously, these electrical connections may interface directly with the MEMS layer (i.e. a silicon layer in typical implementations). For closed loop operation, a signal controller may be arranged to apply in-phase and anti-phase pulse width modulation (PWM) drive signals to the two sets of fixed capacitive electrode fingers. The output voltage obtained from the electrical pick-off connections (i.e. from the proof mass) is then used as an error input signal to drive a closed loop servo, to vary a mark/space ratio of the PWM drive signals and to maintain the proof mass in the null position.

BRIEF DESCRIPTION OF THE DRAWINGS

One or more non-limiting examples will now be described with reference to the accompanying drawings in which:

FIGS. 6A to 6C show a series of waveforms illustrating the closed loop operation of the accelerometer of FIG. 3.

DETAILED DESCRIPTION

Figure 1:
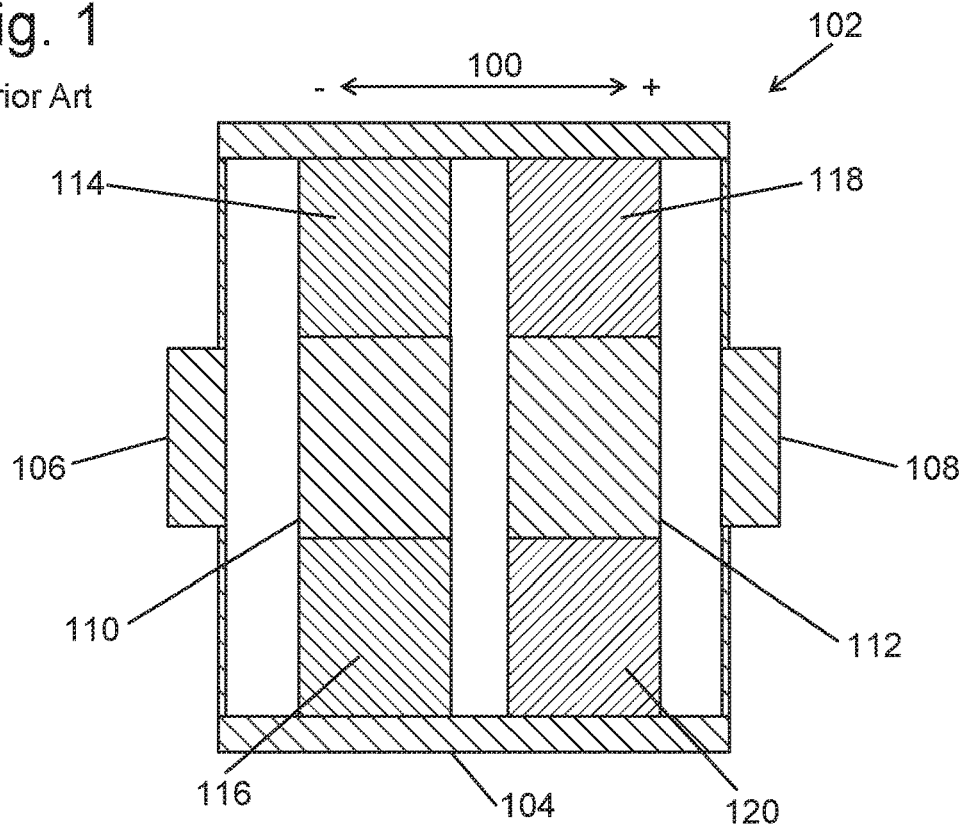
FIG. 1 shows a conventional accelerometer.

FIG. 1 shows a conventional accelerometer 102 known in the art per se. The accelerometer 102 comprises a moveable frame 104 (i.e. the proof mass) which is anchored to a glass substrate (not shown) via two anchor points 106, 108. The accelerometer 102 also comprises two electrodes 110, 112 which are mounted to the substrate.

Sets of tapered fingers (shown in FIG. 2) are extend from both the electrodes 110, 112 and the frame 104, and define four quadrants 114, 116, 118, 120 of interdigitated fingers 121, 122.

The accelerometer 102 is arranged to be sensitive along a sensing axis 100, such that accelerations along this axis 100 cause the frame 104 to move relative to the support, causing a linear movement of the moveable fingers extending from the frame 104 relative to the fixed capacitive electrode fingers extending from the electrodes 110, 112. This movement causes the capacitance between pairs of adjacent fingers to change due to the change in distance between them. This change in differential capacitance can then be sensed by the electrodes 110, 112.

Figure 2:
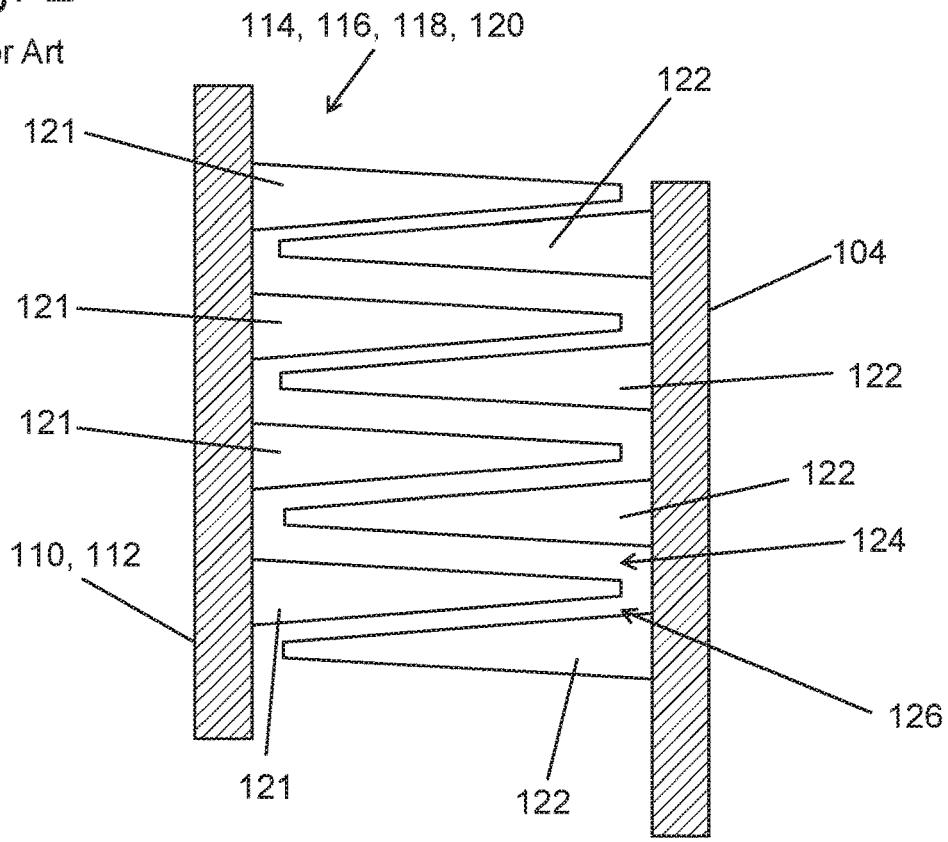
FIG. 2 shows the combined finger arrangement typical of the accelerometer of FIG. 1.

FIG. 2 shows the combined finger arrangement typical of the accelerometer 102 of FIG. 1. More specifically, FIG. 2 shows a close up view of the interdigitated fingers 121, 122 that can be found in each of the quadrants 114, 116, 118, 120. One set of tapered fixed fingers 121 extends from the electrodes 110, 112 and another moveable set 122 extends from the moveable frame 104. The capacitive electrode fingers 121 that extend from the electrodes 110, 112 are fixed in place and cannot move relative to the accelerometer 102. The capacitive electrode fingers 122 extending from the frame 104 can move, and thus the gaps 124, 126 between the moveable fingers 122 and the fixed fingers 121 are variable.

It is noteworthy that there is a difference in the size of the gaps 124, 126 either side of each finger in an interdigitated pair, i.e. there is an offset between the capacitive electrode fingers. The accelerometer 102 is designed such that the two quadrants 114, 116 adjacent to the left-hand electrode 110 have the larger gaps 124 closest to anchor point 106, while the other two quadrants 118, 120 adjacent to the right-hand electrode 112 have the larger gaps 124 closest to anchor point 108. This symmetry (symmetrical across a vertical line through the device) provides a differential capacitor with a central electrode (i.e. the moveable capacitive electrode fingers 122) and two side electrodes 110, 112. This differential capacitor arrangement allows the device to sense acceleration in both directions along the sensing axis 100. As the frame 104 (i.e. the proof mass) moves along the sensing axis 100, the capacitance between the central electrode 122 and one of the side electrodes 110, 112 will increase, while the capacitance between the central electrode and the other side electrode 110, 112 will decrease.

In this particular example, each of the capacitive electrode fingers 121, 122 are typically 20 microns wide at the root, tapering to 12 microns at the tip. The larger gaps 124 are typically 16 microns while the smaller gaps 126 are typically 6 microns, thus leading to a pitch of 44 microns.

Figure 3:
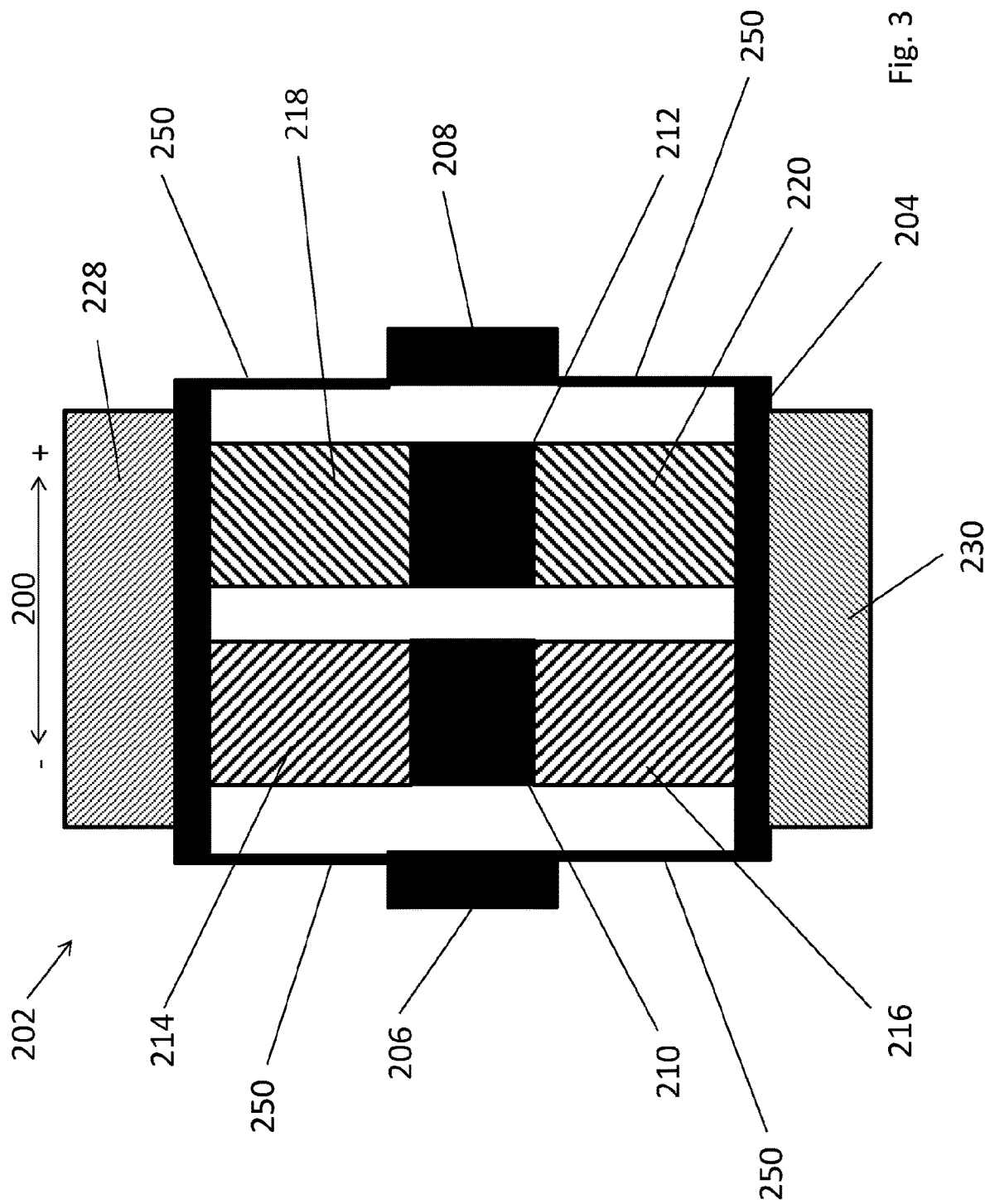
FIG. 3 shows an accelerometer in accordance with an example of the present disclosure.

FIG. 3 shows an accelerometer 202 in accordance with an example of the present disclosure. The accelerometer 202 comprises a moveable frame 204 which is anchored to a glass substrate (not shown) via two anchor points 206, 208 by flexible legs 250. The accelerometer 202 also comprises two fixed electrodes 210, 212 which are mounted to the substrate.

Figure 4:
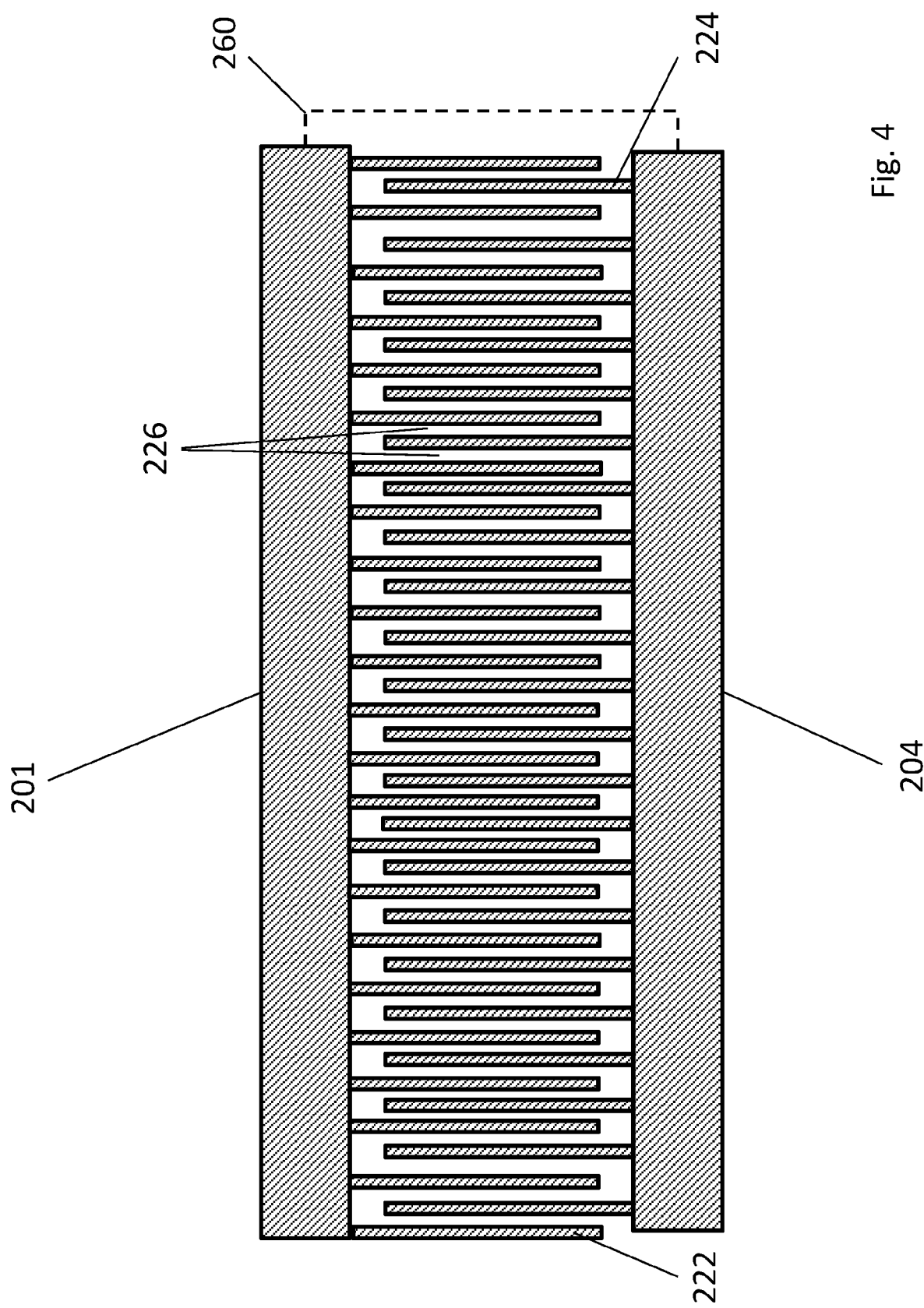
FIG. 4 shows a set of damping fingers typical of the accelerometer of FIG. 3.

Sets of tapered fingers (similar to those shown in FIG. 2) extend from both the fixed electrodes 210, 212 and the moveable frame 204, and define four quadrants 214, 216, 218, 220 of interdigitated capacitive electrode fingers 222, 224 (shown in FIG. 4).

The accelerometer 202 is arranged to be sensitive along a sensing axis 200, such that accelerations along this axis 200 cause the moveable frame 204 to move relative to the support, causing a movement of the moveable capacitive electrode fingers that extend from the frame 204 relative to the fixed capacitive electrode fingers that extend from the fixed electrodes 210, 212. As described with reference to FIG. 2, since the accelerometer 202 is essentially arranged as a differential capacitor with a central electrode (i.e. the moveable capacitive electrode fingers) and two side fixed electrodes 210, 212, the accelerometer 202 is arranged to sense acceleration in both directions along the sensing axis 200. As the moveable frame 204 (i.e. the proof mass) moves along the sensing axis 200, the capacitance between the central electrode and one of the side electrodes 210, 212 will increase, while the capacitance between the central electrode and the other side electrode 210, 212 will decrease. The moveable frame 204 provides electrical pick-off connections (not shown) which can be used to take an output voltage $V_{out}$ from the accelerometer 202 for sensing an applied acceleration. The fixed electrodes 210, 212 provide further electrical connections that provide the ability for applying drive voltages $V_1$ and $V_2$ to the accelerometer 202 in order to maintain the proof mass (i.e. the moveable frame 204) at a null position using an opposing electrostatic force (i.e. for operating the accelerometer 202 in closed loop), as described in greater detail with reference to FIGS. 5 and 6A to 6C.

The flexible support legs 250 are implemented with a particular length and width which, along with the combined mass supported by the legs 250, sets the resonance frequency, which is typically in the range of 1-5 kHz (depending on the required sensitivity of the accelerometer).

As will be discussed further with reference to FIGS. 5 and 6A to 6C, when operated in closed loop, the fixed electrodes 210, 212 are used to provide drive voltages $V_1$, $V_2$ to the fixed electrodes 210, 212 so as to oppose any change in position caused by acceleration. Drive voltages $V_1$, $V_2$ are also applied to the fixed electrodes 210, 212 in open loop operation, but are not used for restoring the moveable frame 204 back to the null position and are thus of a lower amplitude than those used in closed loop operation.

Also attached to the accelerometer 202 are two sets of dedicated damping fingers 228, 230 which are shown more closely in FIG. 4 below. These damping fingers 228, 230 are not used for capacitive sensing or applying a restorative voltage, but instead are specifically adapted so as to provide enhanced squeeze film damping.

The dedicated set of damping fingers 228, 230 provide advantages to the accelerometer 202 when operated in either open or closed loop, providing better damping characteristics than can be found in conventional accelerometers.

FIG. 4 shows a set of damping fingers 228, 230 typical of the accelerometer 202 shown in FIG. 3. These sets of damping fingers 228, 230 are also interdigitated and comprise a fixed set of damping fingers 222 mounted to the glass substrate 201 and a moveable set of damping fingers 224 extending from the frame 204.

As can be seen from FIG. 4, the spacing 226 between adjacent interdigitated fixed and moveable damping fingers 222, 224 is equal on both sides. This allows for a uniform squeeze film damping effect to take place in both directions along the sensing axis 200.

In this particular example, each of the damping fingers is 8 microns wide and 700 microns long, and the spacing between adjacent fingers within the fixed and moveable finger sets 222, 224 is 6 microns. This leads to a pitch of 28 microns, which is much lower than that of the capacitive electrode fingers used for sensing and, in the case of closed loop operation, driving. This provides the accelerometer 202 with an increased damping factor of approximately 2.5, compared with a damping factor of 0.5 which is typical of conventional accelerometers known in the art.

The two sets of damping fingers 222, 224 are electrically connected to one another by a conducting metallic contact 260 that serves to make the sets of damping fingers 222, 224 electrically common to one another. This prevents any electrostatic forces from acting on the damping fingers 222, 224 which would oppose the squeeze film damping effect, thus further enhancing the damping factor of the accelerometer 202. While illustrated herein as a dashed line, the metallic contact 260 is typically implemented as one or more metal tracks that trace a path from the fixed set of damping fingers 222 along the surface of the glass substrate 201 and are then connected to the frame 204 by down hole vias. As the one or more metal tracks 260 electrically connect the set of fixed damping 222 fingers to the proof mass (i.e. the frame 204), the interdigitated fixed and moveable damping fingers 222, 224 are electrically common.

Figure 5:
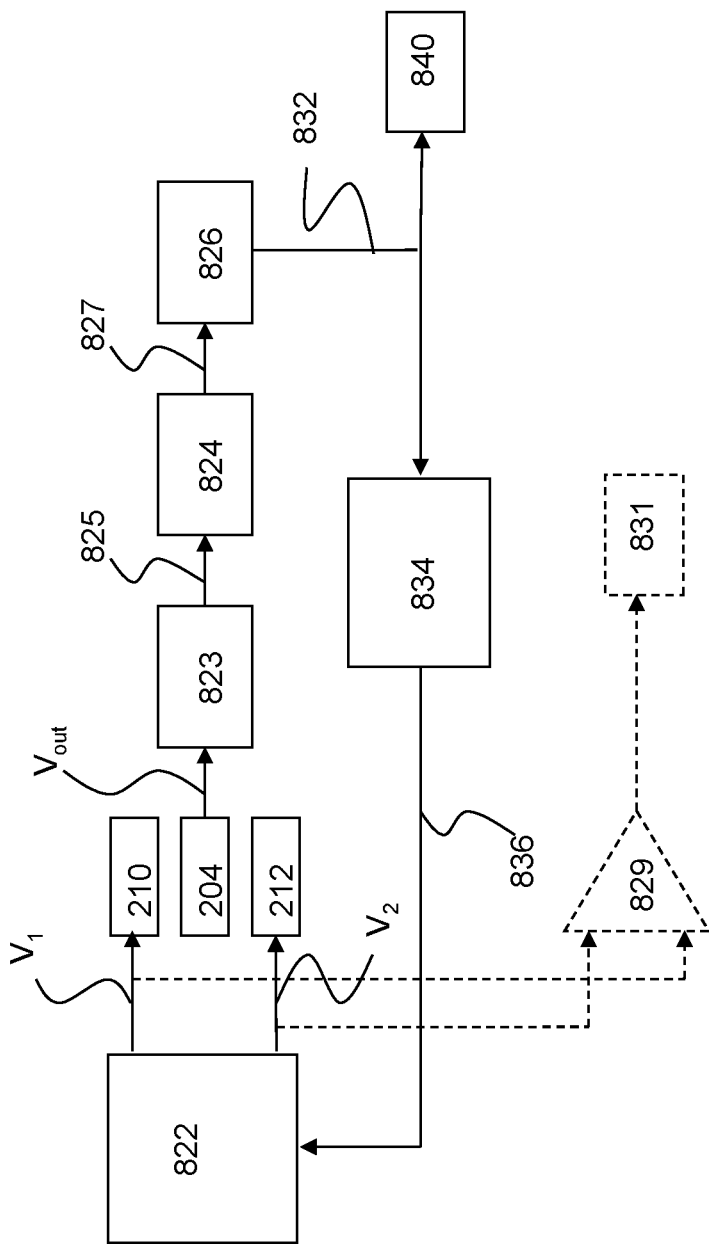
FIG. 5 shows a block diagram of an exemplary closed loop electronic control circuit for operating the accelerometer of FIG. 3.

FIG. 5 shows a block diagram of an exemplary closed loop electronic control circuit for operating the accelerometer of FIG. 3. A pulse width modulation (PWM) drive voltage generator 822 provides in-phase and anti-phase voltage signals $V_1$ and $V_2$ to first and second sets of fixed electrodes 210, 212, respectively (exemplary waveforms are shown in FIGS. 6A to 6C). An output voltage $V_{out}$ from the moveable frame 204 is provided to a pre-amp 823 and its output 825 is provided to a demodulator 824. The resultant output 827 represents the displacement of the proof mass (i.e. the moveable frame 204) from the null position. The output 827 then passes through an integrator/loop filter 826 to provide an output 832 representing the required restoring force due to the displacement of the moveable frame 204 from the null position i.e. proportional to the applied acceleration.

The integrated and filtered output 832 passes to a PWM drive voltage control circuit 834 comprising a PWM mark/space ratio generator which drives the PWM drive voltage generator 822 such that the moveable frame 204 is held in the null position, which in turn drives the demodulator output 827 to a null value. The PWM mark:space ratio determines the restoring force and is proportional to the applied acceleration. It may be seen that two alternative output stages are available. One option is for the integrator/loop filter 826 to directly provide the suitably filtered signal 832, which is proportional to the applied acceleration, at an output 840. This is a digital signal so can be used without introducing additional errors. Alternatively, or in addition, a comparator such as a differential amplifier 829 may compare the PWM drive voltages $V_1$ and $V_2$ to measure the restoring force and thus provide an output at 831 proportional to the applied acceleration. This signal 831 is an analogue signal that can be filtered or digitised as appropriate to match the requirements of the system. This may offer a higher performance system, as errors within the PWM voltage generator 822 or control 834 will be suppressed by the closed loop operation.

FIGS. 6A to 6C show a series of PWM waveforms of voltage signals $V_1$, $V_2$ applied to the fixed electrodes 210, 212 respectively, illustrating the operation of the accelerometer 202 shown in FIG. 3. The accelerometer 202 is operated using pulse width modulation (PWM) signals applied to each of the electrodes 210, 212 whereby the voltages applied to each of the electrodes 210, 212 are in anti-phase and thus while the "high" voltage 500 (typically around 35 V in closed loop operation) is applied to one electrode, a "low" voltage 502 (typically zero volts) is applied to the other.

FIG. 6A illustrates the PWM waveforms when the accelerometer 202 is not undergoing acceleration, or is being operated in open loop. FIG. 6A shows the typical in-phase and anti-phase voltage signals $V_1$, $V_2$ that are applied to the fixed electrodes 210, 212 respectively when the accelerometer 202 is not undergoing acceleration (i.e. it is measuring 0 g). In this instance, the mark/space ratio (i.e. the ratio of how long a given electrode is provided with the positive voltage 500 compared to the low voltage 502) is 50:50. Since the frame 204 (i.e. the proof mass) is in its null position, the moveable capacitive electrode finger set in each of the quadrants 214, 216, 218, 220 are all in also their null position, and no restorative force is needed.

The voltage signals $V_1$ and $V_2$ shown in FIG. 6A are of the same form as those applied to the fixed electrodes 210, 212 when the accelerometer 202 is being operated in open loop, wherein the mark/space ratio is not varied. When operated in open loop, the high voltage 500 of these signals is typically around 3 V. Since no restorative force is applied in open loop regardless of the applied acceleration, the mark/space ratio is maintained at 50:50

FIG. 6B shows the typical voltage signals $V_1$, $V_2$ that are applied to the fixed electrodes 210, 212 respectively when the accelerometer 202 is undergoing acceleration in the negative direction along the sensing axis 200 (i.e. it is measuring a large negative g) when the accelerometer 202 is being operated in closed loop. Since the frame 204 and accordingly the moveable capacitive electrode finger set in each of the quadrants 214, 216, 218, 220 are now displaced from their null position, the mark/space ratio is adjusted by the control 834 and PWM voltage generator 822 (seen in FIG. 5) such that one side e.g. left fixed electrode 210 is provided with the high voltage 500 for longer than it is provided the low voltage 502, with the reverse being true for the other side e.g. right fixed electrode 212. This acts the restore the frame 204 to its null position.

FIG. 6C shows the typical voltage signals $V_1$, $V_2$ that are applied to the fixed electrodes 210, 212 respectively when the accelerometer 202 is undergoing acceleration in the positive direction along the sensing axis 200 (i.e. it is measuring a large positive g) when the accelerometer 202 is being operated in closed loop. Now the mark/space ratio is adjusted such that one side e.g. right fixed electrode 212 is provided with the high voltage 500 for longer than it is provided the low voltage 502, with the reverse being true for the other side e.g. left fixed electrode 210. This once again acts the restore the frame 204 to its null position, but by now applying a force in the opposite direction. Such a closed loop operation is described in more detail in WO 2005/083451, the contents of which are incorporated by reference.

While the closed loop operation of the accelerometer 202 has been described in further detail, it will be appreciated by those skilled in the art that the enhanced damping performance of the accelerometer disclosed herein is also beneficial to open loop accelerometers (i.e. wherein a drive signal with a consistent 50:50 mark/space ratio and a typical peak voltage of approximately 3 V is used to provide open loop drive and sensing but not a restorative force as described above with reference to FIG. 6A).

Thus it will be seen that an improved accelerometer that comprises a separate, dedicated set of fingers for damping purposes has been described herein.

Although particular examples have been described in detail, it will be appreciated by those skilled in the art that many variations and modifications are possible using the principles of the disclosure set out herein.

The invention claimed is:

1. A capacitive accelerometer comprising:
a substantially planar proof mass mounted to a fixed substrate by flexible support legs so as to be linearly moveable in an in-plane sensing direction in response to an applied acceleration, the proof mass comprising first and second sets of moveable capacitive electrode fingers extending from the proof mass substantially perpendicular to the sensing direction and laterally spaced in the sensing direction;
first and second fixed capacitor electrodes mounted to the fixed substrate, the first fixed capacitor electrode comprising a first set of fixed capacitive electrode fingers and the second fixed capacitor electrode comprising a second set of fixed capacitive electrode fingers, wherein the first and second sets of fixed capacitive electrode fingers extend substantially perpendicular to the sensing direction and are laterally spaced in the sensing direction;
the first set of fixed capacitive electrode fingers arranged to interdigitate with the first set of moveable capacitive electrode fingers of the proof mass and the second set of fixed capacitive electrode fingers arranged to interdigitate with the second set of moveable capacitive electrode fingers of the proof mass, the first and second sets of moveable capacitive electrode fingers further comprising electrical pick-off connections arranged to provide an output voltage, in use, for sensing an applied acceleration;
wherein the first set of moveable capacitive electrode fingers is provided with a first non-zero offset in a first direction from a first median line between adjacent ones of the first set of fixed capacitive electrode fingers; and
wherein the second set of moveable capacitive electrode fingers is provided with a second non-zero offset in a second, opposite direction from a second median line between adjacent ones of the second set of fixed capacitive electrode fingers, wherein the first and second offsets are substantially symmetrical across a median line between the first and second fixed capacitor electrodes;
the proof mass further comprising a set of moveable damping fingers extending from the proof mass substantially perpendicular to the sensing direction and laterally spaced in the sensing direction and a set of fixed damping fingers mounted to the fixed substrate and arranged to interdigitate with the set of moveable damping fingers, the fixed damping fingers extending substantially perpendicular to the sensing direction and laterally spaced in the sensing direction;
wherein the set of fixed damping fingers comprises an electrical connection to the proof mass so that the interdigitated fixed and moveable damping fingers are electrically common; and
wherein the interdigitated moveable and fixed damping fingers are mounted in a gaseous medium that provides a damping effect counteracting relative displacement between the moveable and fixed damping fingers when the proof mass tends to move in response to an applied acceleration.

2. The capacitive accelerometer as claimed in claim 1, wherein each of the interdigitated damping fingers is narrower than the interdigitated capacitive electrode fingers.

3. The capacitive accelerometer as claimed in claim 1, wherein a width at a root of each damping finger is 15 microns or less.

4. The capacitive accelerometer as claimed in claim 1, wherein the interdigitated damping fingers are substantially equally spaced in the sensing direction.

5. The capacitive accelerometer as claimed in claim 1, wherein a gap between adjacent damping fingers is less than 16 microns.

6. The capacitive accelerometer as claimed in claim 1, wherein the interdigitated set of damping fingers are laterally spaced with a greater density than the interdigitated set of capacitive electrode fingers.

7. The capacitive accelerometer as claimed in claim 1, wherein a pitch of the damping fingers is less than 50 microns.

8. The capacitive accelerometer as claimed in claim 1, comprising a plurality of interdigitated damping finger sets arranged substantially symmetrically.

9. The capacitive accelerometer as claimed in claim 1, wherein the proof mass comprises a frame that encloses the moveable and fixed capacitive electrode fingers, and the interdigitated set of damping fingers is positioned outside the frame.

10. The capacitive accelerometer as claimed in claim 1, wherein the capacitive electrode fingers and/or damping fingers are trapezoidal.

11. The capacitive accelerometer as claimed in claim 1, comprising a sealed unit wherein the capacitive electrode fingers and the damping fingers are mounted in the same gaseous medium.

12. The capacitive accelerometer as claimed in claim 1, wherein the first and second fixed capacitive electrode fingers comprise electrical connections arranged to provide a drive voltage.

13. The capacitive accelerometer as claimed in claim 12, further comprising a signal controller arranged to:
apply in-phase and anti-phase pulse width modulation (PWM) drive signals to the first and second sets of fixed capacitive electrode fingers; and
use the output voltage obtained from the electrical pick-off connections to vary a mark/space ratio of the PWM drive signals.

14. A method of operating a capacitive accelerometer comprising:
a substantially planar proof mass mounted to a fixed substrate by flexible support legs so as to be linearly moveable in an in-plane sensing direction in response to an applied acceleration, the proof mass comprising first and second sets of moveable capacitive electrode fingers extending from the proof mass substantially perpendicular to the sensing direction and laterally spaced in the sensing direction;

first and second fixed capacitor electrodes mounted to the fixed substrate, the first fixed capacitor electrode comprising a first set of fixed capacitive electrode fingers and the second fixed capacitor electrode comprising a second set of fixed capacitive electrode fingers, wherein the first and second sets of fixed capacitive electrode fingers extend substantially perpendicular to the sensing direction and are laterally spaced in the sensing direction;

the first set of fixed capacitive electrode fingers arranged to interdigitate with the first set of moveable capacitive electrode fingers of the proof mass and the second set of fixed capacitive electrode fingers arranged to interdigitate with the second set of moveable capacitive electrode fingers of the proof mass, the first and second sets of moveable capacitive electrode fingers further comprising electrical pick-off connections arranged to provide an output voltage, in use, for sensing an applied acceleration;

wherein the first set of moveable capacitive electrode fingers is provided with a first non-zero offset in a first direction from a first median line between adjacent ones of the first set of fixed capacitive electrode fingers; and wherein the second set of moveable capacitive electrode fingers is provided with a second non-zero offset in a second, opposite direction from a second median line between adjacent ones of the second set of fixed capacitive electrode fingers, wherein the first and second offsets are substantially symmetrical across a median line between the first and second fixed capacitor electrodes;

the proof mass further comprising a set of moveable damping fingers extending from the proof mass substantially perpendicular to the sensing direction and laterally spaced in the sensing direction, and a set of fixed damping fingers arranged to interdigitate with the set of moveable damping fingers, the fixed damping fingers extending substantially perpendicular to the sensing direction and laterally spaced in the sensing direction; wherein the set of fixed damping fingers comprises an electrical connection to the proof mass so that the interdigitated fixed and moveable damping fingers are electrically common; and wherein the interdigitated moveable and fixed damping fingers are mounted in a gaseous medium that provides a damping effect counteracting relative displacement between the moveable and fixed damping fingers when the proof mass tends to move in response to an applied acceleration;

the method comprising:

obtaining the output voltage from the electrical pick-off connections and processing the output voltage to determine therefrom the applied acceleration.

15. The method as claimed in claim 14, wherein the method comprises:

applying in-phase and anti-phase pulse width modulation (PWM) drive signals to the first and second sets of fixed capacitive electrode fingers; and wherein processing the output voltage comprises using the output voltage obtained from the electrical pick-off connections to vary a mark/space ratio of the PWM drive signals.

* * * * *